United States Patent [19]

Pundsack

[11] 3,971,334

[45] July 27, 1976

[54] COATING DEVICE

[75] Inventor: Arnold L. Pundsack, Oakville, Canada

[73] Assignee: Xerox Corporation, Stamford, Conn.

[22] Filed: Mar. 4, 1975

[21] Appl. No.: 555,339

[52] U.S. Cl. .................... 118/5; 118/8; 118/49; 219/275
[51] Int. Cl.² ......................................... C23C 13/12
[58] Field of Search ............... 118/5, 7, 8, 48–49.5; 13/20; 219/271–276; 432/262–265; 427/50–52, 69, 70, 91, 109, 166, 167, 248–255

[56] References Cited
UNITED STATES PATENTS

| | | | |
|---|---|---|---|
| 580,248 | 4/1897 | Biemann | 118/48 |
| 2,440,135 | 4/1948 | Alexander | 118/49 X |
| 2,793,609 | 5/1957 | Shen et al. | 118/49 |
| 2,945,771 | 7/1960 | Mansfeld | 118/49 X |
| 2,975,753 | 3/1961 | Hayes | 118/49 |
| 3,446,936 | 5/1969 | Hanson et al. | 118/49.1 |

*Primary Examiner*—Morris Kaplan

[57] ABSTRACT

A device for coating a condensed metallic vapor onto a confined area of a substrate wherein the crucible producing the vapor is dimensionally stabilized and contains a variable aperature positioned relative to the vapor exit means of the crucible so as to provide a restricted line-of-sight path of travel for the vapors from the reservoir to the substrate being coated.

36 Claims, 5 Drawing Figures

COATING DEVICE

BACKGROUND OF THE INVENTION

This invention relates to a coating device and more particularly to a device for coating a condensed metal vapor onto a continuous web.

The coating of material by condensing a vapor thereon has long been known and such coatings have many uses. For example, printed wire circuit board is produced by depositing metal vapor on an element having a pattern defining means according to U.S. Pat. No. 2,948,261 to McGraw, Jr. Selenium rectifiers can be prepared by the coating of condensed selenium vapor such as is disclosed in U.S. Pat. No. 2,426,377 to Smith. Magnetic tape is produced by vapor deposition of magnetic material on a web according to U.S. Pat. No. 2,671,034 to Steinfeld. Condensed vapor deposition devices for the production of a variety of coatings are disclosed in U.S. Pat. No. 1,160,980, to Geer, U.S. Pat. No. 3,394,678 to Edwards et al., U.S. Pat. No. 2,440,135 to Alexander, U.S. Pat. No. 3,046,936 to Simons, Jr., U.S. Pat. No. 3,081,201 to Koller and U.S. Pat. No. 3,086,889 to Strong. In all such patents, the crucible employed does not provide direction of the vapor onto the substrate being coated.

More recently, there has been discovered a migration imaging method wherein a layer of particles are caused to migrate through a softenable layer in imagewise configuration. Such layer can be created by condensing metal vapor on the softenable layer by a process such as is disclosed in U.S. Pat. No. 3,598,644 to Goffe, et al., said patent hereby incorporated by reference.

Although uniformity of particle size and deposition on the substrate is desired in all cases, the formation of an imaging member for use in the migration imaging process is perhaps the most demanding with respect to such uniformity. Slight variations are detected by the quality of images produced by the imaging member which variations would perhaps not be detected in the coatings provided for other uses. The high temperature required for metal vaporization causes dimensional changes in the crucible and while such changes are small, the effects of such changes are sufficient to cause undesired variation in a layer employed in the migration imaging process.

Accordingly, when traditional vapor deposition systems are employed to provide migration imaging members, variations in the coating are detected as, for example, by measuring low blue light density (wratten filter No. 94) of the coating for a given white light density. This results in lowered image contrast in blue light. In addition, width uniformity of the coating varies intermittently. Thus, an improved means for coating is desired to provide highly uniform coatings particularly useful in migration imaging members.

SUMMARY OF THE INVENTION

It is an object of this invention to provide improved coating means for vapor deposition of materials.

Another object of this invention is to provide an apparatus for continuously coating a substrate in web configuration.

Another object of this invention is to provide improved vapor producing means in a coating apparatus.

Another object of this invention is to provide improved migration imaging members.

In accordance with this invention, there is provided a crucible wherein a coating material is vaporized and allowed to escape therefrom to condense on a confined area of a substrate and in a controlled amount. These improvements are achieved by providing a continuously regulatable variable aperture means positioned relative to the vapor exit means so as to provide a line-of-sight path of travel for the vapor emitted from the reservoir chamber confining the evaporant to a defined area of the substrate being coated. Also, the crucible is provided with reinforcement means so as to provide dimensional stability and resistance to warpage at high temperatures.

The preferred embodiment of this invention is a coating apparatus utilizing the crucible to provide a fracturable layer comprising discrete particles of selenium on a softenable substrate. In a further preferred embodiment the discrete particles are at least partially or totally embedded in the substrate. Such layers provide optimum quality migration images when employed in the migration imaging process as described in U.S. Pat. No. 3,520,681 hereby incorporated by reference.

In one aspect of this invention, there is provided a vacuum coating apparatus for continuously coating a web material. The temperature of the web, in large measure, determines the nature of the particles of condensed vapor. Thus, one desiring a uniformly coated web must coat the web at a narrow temperature range in addition to applying a uniform amount of vapor. In the prior art, vapors emitted from the crucible followed random direction and thus condensed on the web at different points. Since it is cumbersome to maintain the coating surface at a uniform temperature over a wide area the vapor condensed at different temperatures on the surface thus providing non-uniform coatings.

In accordance with this invention, a vapor exit chamber is provided in the crucible which confines the direction of vapor emitted therefrom to a narrow area on the surface being coated.

BRIEF DESCRIPTION OF THE DRAWINGS

For a better understanding of the invention as well as other objects and further features thereof, reference is made to the following detailed disclosure of the invention taken in conjunction with the accompanying drawings wherein.

DETAILED DESCRIPTION OF THE DRAWINGS

Figure 1:
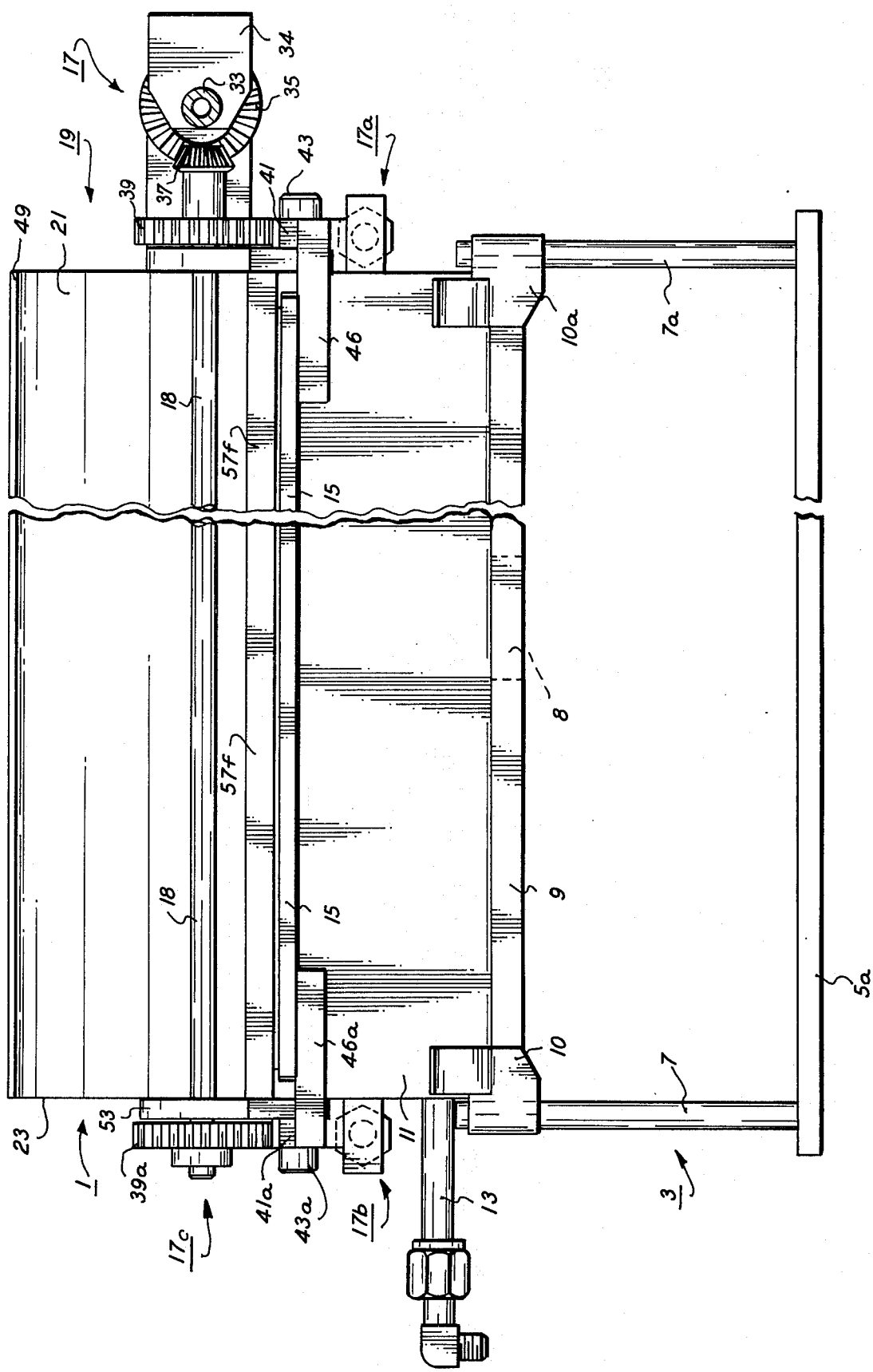
FIG. 1 is a front elevation view of the crucible of this invention.

In FIG. 1 there is shown a preferred embodiment wherein crucible 1 rests upon bed 3. Bed 3 comprises a base 5 having vertically extending legs 7 and 7a. For additional support, struts 8 running from front to rear also support crucible 1 between rails 9 and 9a (not shown). Slidably mounted on each leg are clamps 10 and 10a which hold crucible 1 in an elevated position adjustable in the vertical plane by means of the movement of clamps 10 and 10a along legs 7 and 7a.

Crucible 1 comprises reservoir 11 which holds the evaporant. In a preferred embodiment the evaporant is heated by induction heating means, not shown, wherein the entire assembly is subjected to an electrical current, typically in the range of about 300 amperes, at a typical voltage of about 5 volts. The crucible is heated to the desired temperature (see back of page 5). The temperature can be optionally further controlled by introducing coolant into reservoir 11 through conduit 13.

Over reservoir 11 there is provided an adjustable aperture means. Shown in FIG. 1, in the front is one of a pair of adjustable shutters 15. As will be more fully described below, front shutter 15 is positionally adjustable frontward and rearward so as to regulate the aperture formed between the shutters within crucible 1. Shutter positioning means 17, in this embodiment, comprises a gear train, but any suitable positioning means such as hydraulic or pneumatic means can be employed. Axle 18 turns matching gears attached to shutter 15 on the opposite ends of crucible 1.

Above aperture means 15 there is provided vapor exit chamber 19. Vapor exit chamber 19 is composed of concave side member 21, and, not shown in FIG. 1, end members and a vertical side member. Vapors produced in reservoir 11 pass into exit chamber 19 and thence out of crucible 1 through exit aperture 23. As will be more fully described below, crucible 1 is interiorly constructed so as to provide a substantially uniform direction for vapor emitted through exit aperture 23.

Figure 2:
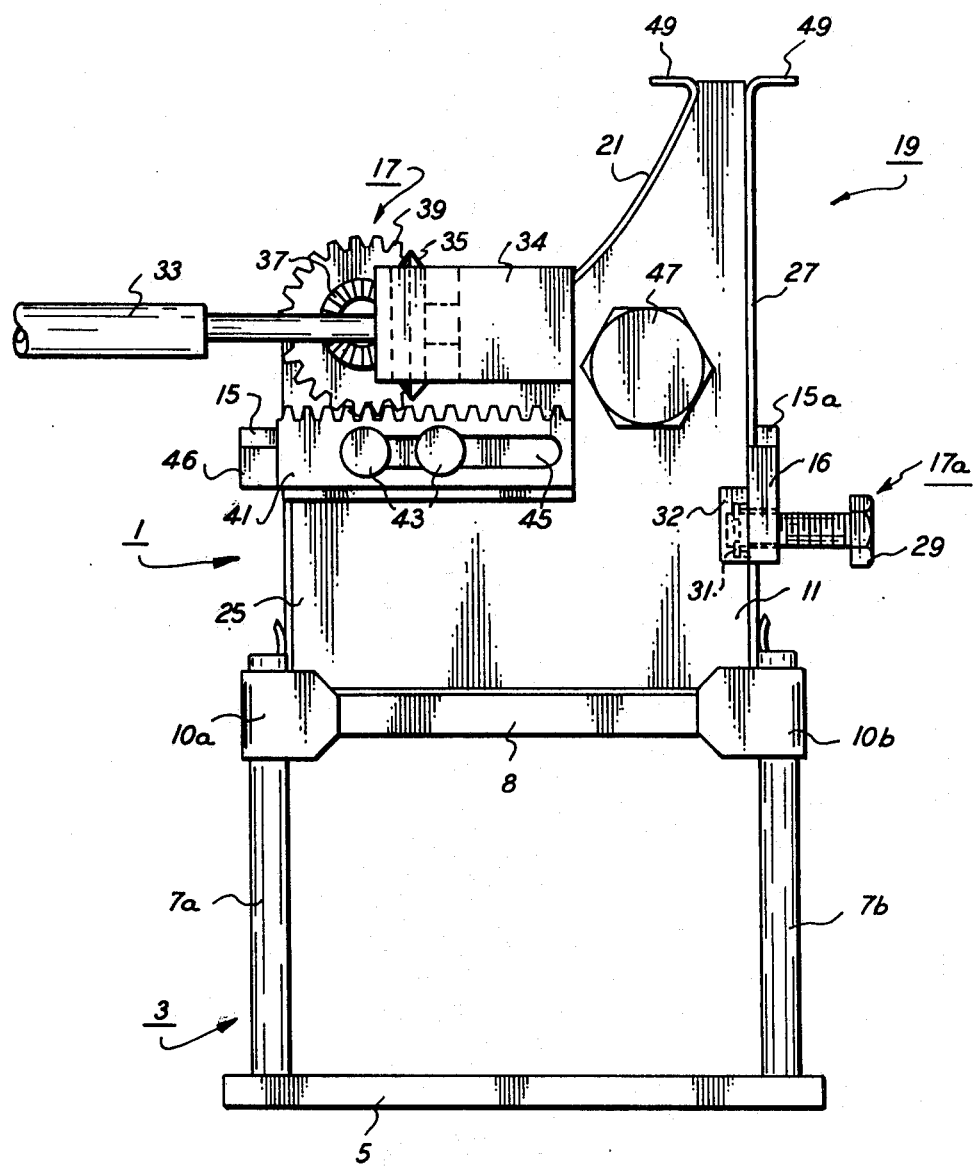
FIG. 2 is a right end elevational view of the crucible of this invention.

In FIG. 2 where is shown bed 3, including leg 7a, base 5 and rear leg 7b. Clamps 10a and 10b hold crucible 1 onto bed 3. In this view, there is shown the use of a common end member 25 for both reservoir 11 and exit chamber 19. Concave side member 21 and vertical side member 27 are mounted on end member 25. In this view, there is seen shutter positioning means 17 for the front shutter and positioning means 17a operatively associated with shutter 15a through block 16. In this embodiment, threaded screw member 29 is inserted in a threaded hole in block 16 and secured in an unthreaded portion by retaining ring 31 attached to end member 25 through block 32. Rear shutter positioning means 17a is matched at the left end and by rotating both threaded screws shutter 15a is caused to move frontward or rearward thus defining the rear boundry of the aperture between reservoir 11 and exit chamber 19.

To adjust the front boundary of the aperture between reservoir 11 and exit chamber 19, there is provided gear train 17 operated by rotatable shaft 33. Shaft 33 is braced by bracket 34 mounted on crucible 1. As shaft 33 rotates, bevel gear 35 rotates and drives engaged bevel gear 37. The axle of bevel gear 37 is common with the axle of gear 39 and thus both gears rotate together. Rack gear 41 engages gear 39 and is driven forward and rearward on crucible 1. Rack gear 41 is slidably mounted on end member 25 through pins 43 in slot 45. Shutter 15 is connected to rack gear 41 through block 46. In order to conveniently fill reservoir 11, plug 47 can be removed leaving an opening through end member 25. The reservoir 11 can be conveniently loaded with evaporant with shutters 15 and 15a, extended outwardly from crucible 1.

As noted earlier, dimensional stability of crucible 1 at elevated temperatures is beneficial to uniform vacuum coating. Such stability is aided by the radius provided in concave side member 21. Flanges 49 at the top of side members 21 and 27 further aid in achieving dimensional stability.

Figure 3:
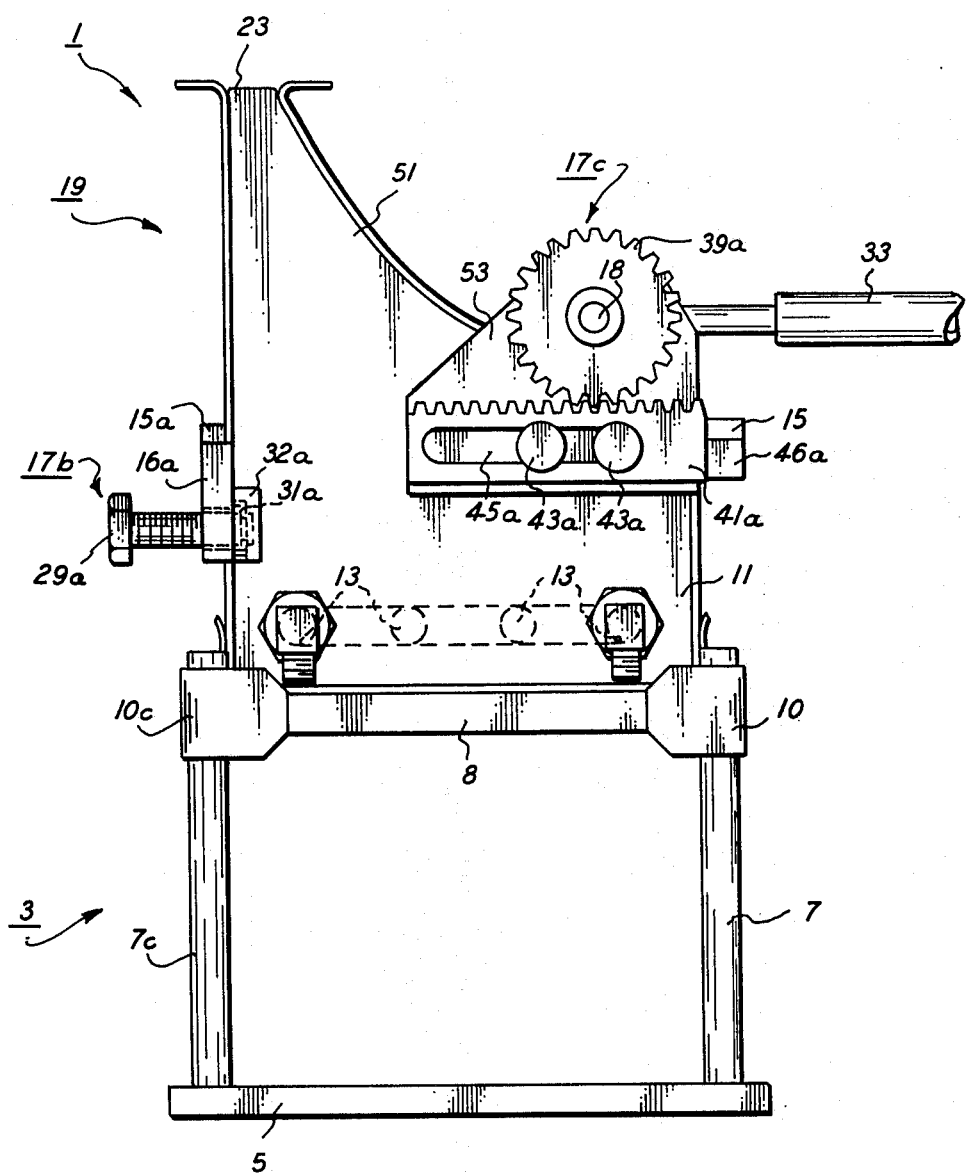
FIG. 3 is a left end elevational view of the crucible of this invention.

FIG. 3 further illustrates the crucible of this invention and illustrates the left end elevation of the device. Crucible 1 rests upon bed 3 comprising base 5, strut 8 and legs 7 and 7c. Clamps 10 and 10c adjustably mount on legs 7 and 7c, respectively.

Conduit 13 is shown entering and leaving reservoir 11. In operation the temperature of the evaporant within reservoir 11 is partially controlled by introducing a coolant through conduit 13. The coolant does not contact the evaporant but follows a circuitous path through reservoir 11 in continuous conduit 13 so as to provide extended contact between the evaporant and conduit 13.

Mounted on common end member 51, in FIG. 3, are shown positioning means 17b and 17c matched with those described in FIG. 2. Thus, for the rear shutter 15a, there is provided threaded screw member 29a threaded through block 16a which is attached to shutter 15a. Retaining ring 31a, mounted through block 32a engages a non-threaded portion of member 29a.

Positioning means for the front shutter 15 comprises gear 39a which is driven by axle 18 running from gear 39 at the opposite end of crucible 1. Gear 39a engages and drives rack gears 41a which is operatively connected with shutter 15 through block 46a. As described above in FIG. 2, rack gear 41a is slidably mounted on pins 43a extending through slot 45a. Positioning means 17c is mounted on end member 51 by block 53.

Figure 4:
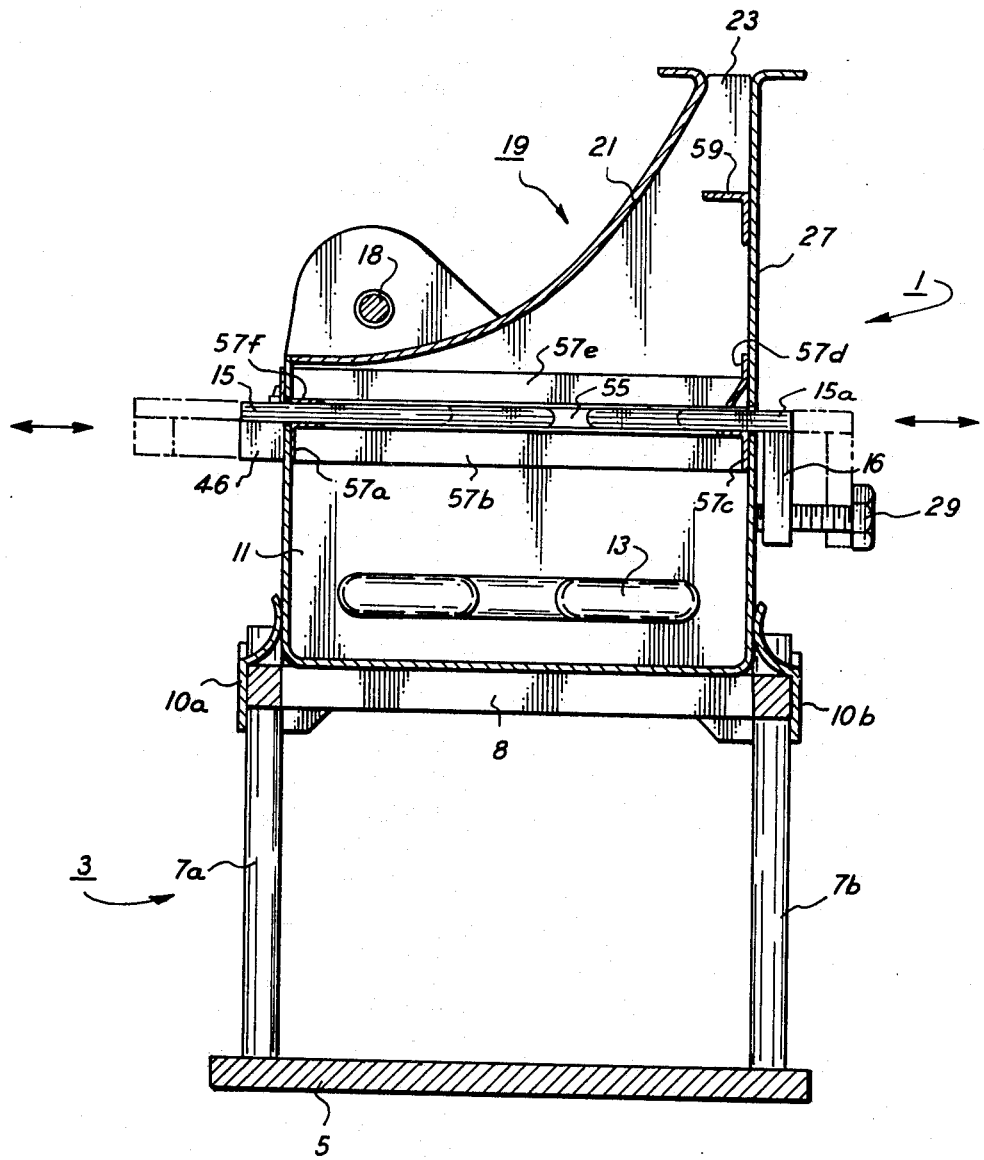
FIG. 4 is a right elevational view in section of the crucible of this invention.

An interior view of crucible 1 is shown in FIG. 4. In this view, end member 25, shown in FIG. 2, is removed together with shutter positioning means 17 and 17a attached thereto. The looped ends of conduit 13 are shown in reservoir 11. Above reservoir 11, there is shown an aperture means shutters 15 and 15a. A preferred construction of shutters 15 and 15a wherein a thin metallic material is formed in a U shape providing a closed end at the aperture 55. For the purpose of maintaining shutters 15 and 15a, freely movable during cold and start-up periods shields 57a–f have been provided mounted on the interior on all sides of crucible 1 above and below shutters 15 and 15a. Thus, all shutters 15 and 15a are provided on all interior walls of crucible 1 adjacent shutters 15 and 15a. Shields 57a–f prevent vapor from condensing on the walls of reservoir 11 and exit chamber 19 to the extent of forming a solid bridge between the shutters and the crucible walls. By extending the shields about one-fourth inch out from each wall, the shutters can be made to clear each wall so as to prevent bridging by condensed evaporant, yet no significant amount of vapor escapes the reservoir or exit chamber in the space provided.

Exit chamber 19 forms a narrow exit aperture 23 at the top of said chamber for the escape of vapors emitted through variable aperture 55. Mounted on vertical side member 27 is baffle 59. The proper positioning of baffle 59 on side 27 and the distance the baffle extends from the side is determined by the position of variable aperture 55 as will be more fully described below. In general, baffle 59 is situated in the range of from about one-half to about two-thirds the distance between shutter 15a and the top of member 27. Baffle 59 extends from vertical side member 27 a distance which permits the baffle to intersect a plane defined by a straight line drawing from the edge of aperture 55 farthest away from wall 27 to the edge of aperture 23 formed by vertical side member 27. In this way, all vapor leaving exit chamber 19 will be directed to a narrow area above exit aperture 23.

Figure 5:
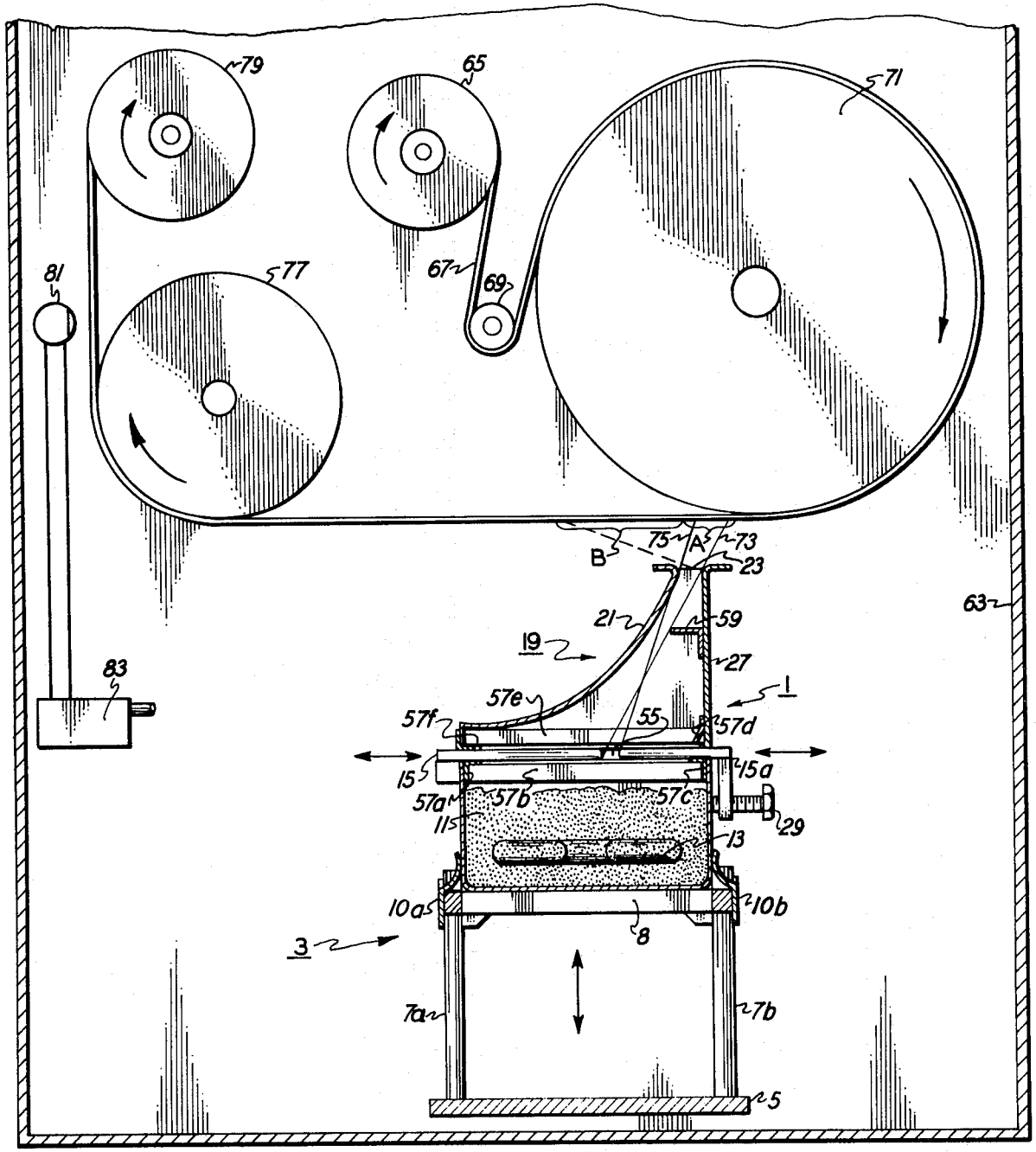
FIG. 5 is an elevational view, partially in section of a coating apparatus of this invention.

The crucible of this invention is particularly useful in a continuous coating method wherein a substrate is continuously passed over the exit aperture to allow the vapors escaping the crucible to condense thereon. In FIG. 5 there is shown, in partial section, an apparatus for vapor depositing material on a substrate. Enclosure means 63, is taken to indicate an enclosure capable of being evacuated of air and of retaining such vacuum. Within the enclosure, there is provided a support means for a substrate to be coated. For the purpose of producing large quantities of coated material, a continuous process is employed whereby a supply of substrate material in web form is retained as shown by feed roll 65. Substrate 67 is fed from roll 65 over idler roll 69 to guide rollers 71 which guides substrate 67 past crucible 1 at a predetermined distance therefrom. Crucible 1 is shown in FIG. 5 substantially as described above in FIG. 4 and the reference numerals are common thereto.

Vapors originating in reservoir 11 pass into exit chamber 19 through aperture 55 formed by aperture means, which in this embodiment consist of shutters 15 and 15a. Through experience, the pattern of vapor emission through an aperture has been found to be in a cosine distribution. Concave side 21 cooperates with baffle 59 so as to prevent emission of vapor from exit chamber 19 through exit aperture 23 except those vapor traveling in a line-of-sight direction from aperture 55 to the general substrate surface area A. Lines 73 and 75 define such line-of-sight. The area of substrate 67 constituting the vapor deposition area is substantially confined between lines 73 and 75 by crucible 1 in the manner of a mask but avoiding any contact of the substrate by such mask. The area is variable by adjustment of shutters 15 and 15a. Thus, when substrate 67 is required to be heated at the point of vapor deposition the area contains a small temperature gradient. As the speed of travel of substrate 67 past exit aperture 23 is increased, shutter 15a is moved rearward thereby extending vapor contact area A into area B of substrate 67. The temperature gradient in the enlarged vapor deposition area A is not substantially increased because of the increase in speed of substrate 67. As pointed out above, vapor emitted through exit aperture 23 uncontrolled as to direction, results in vapor deposition downstream in the path of travel of substrate 67. As substrate 67 leaves roller 71 it contains a temperature gradient along its length because it is cooling. Vapors contacting such areas of substrate 67 containing the temperature gradient, generally designated as area B on substrate 67 in FIG. 5, will produce a coating having a particle size different from any other area of substrate 67 of different temperature. Random deflection from the crucible walls causes the wide range of vaor deposition on substrate 67. By confining the vapors within the exit chamber until its path of travel is in the line-of-sight between aperture 55 and substrate 67, the vapor deposition is confined to a small defined area of substrate 67. One is easily able to control the temperature of a small defined area of substrate 67 thus providing the condition most conductive to the production of uniform coating thereon by vapor deposition.

The position on vertical side member 27 of baffle 59 and also the distance baffle 59 extends from said side member is such as to intersect any plane defined by a straight line drawn between any boundary front or rear of variable aperture 55 to any point on said vertical side member in the area between exit aperture 23 and baffle 59. As shown in FIG. 5, line 73 defines such plane. In this manner no vapor passing through aperture 55 reaches the area of vertical side member 27 above baffle 59 without first being deflected by an interior surface of exit chamber 19 or baffle 59. Vapor traveling directly from aperture 55 to the area of side member 27 above baffle 59 will, in most instances, be deflected from said side member through exit aperture 23 and thence to area B on substrate 67. Thus, baffle 59 is sized and positioned so as to prevent such path of travel of vapor thereby confining the vapor deposition onto substrate 67 substantially to area A.

As noted above, shutter positioning means 17a and 17b adjust the position of shutter 15a. In general, shutter 15a is so positioned as to provide more than a sufficient amount of vapor through aperture 55 for the particular coating operation when shutter 15 is positioned in the plane defined by the line 73 in FIG. 5. Thus, aperture 55 is reduced by moving shutter 15 by shutter positioning means 17.

In the preferred embodiment, one desires to contact substrate 67 with vapor while the substrate is in a single plane. Thus, crucible 1 is positioned below substrate 67 at a point substrate 67 leaves guide rollers 71 and assumes a single plane. This point is also as closely as possible to the area of contact between roller 71 and substrate 67 wherein constant temperature is achieved. Because the contact area A in FIG. 5 is small, the temperature is reasonably uniform when such area is located in the vicinity of the nip formed by substrate 67 leaving roller 71. In addition, when substrate 67 is heated crucible 3 is positioned preferably so as to cause the plane defined by line 73 to intersect substrate 67 at or near the nip formed by roller 71 and substrate 67.

It is to be noted that crucible 1 is situated below substrate 67 in FIG. 5 such that the path of travel of substrate 67 enters the area over exit aperture 61 before entering the area over concave side 21. At high temperature coating operations such as when coating a metallic material, the heat from crucible 1 will materially affect the temperature of substrate 67 by heat convection. In FIG. 5, crucible 1 is shown situated below substrate 67 with concave member 21 downstream to exit aperture 23. In such configuration, the coating operation has already occurred on substrate 67 prior to its passing over concave side member 21 thus any effect on the temperature of substrate 67 is inconsequential to the vapor deposition process.

As substrate 67 passes over crucible 1, as shown in FIG. 5, there is provided cooling roller 77 which quickly reduces the temperature of substrate 67. Should the particular vapor deposition process not require the heating of substrate 67, then roller 77 is not required and the coated substrate is then fed onto takeup roll 79 directly.

In the preferred embodiment of this invention, there is included a coating monitoring means generally indicated by means 81. Such means can vary greatly depending upon the particular coating operation being carried out. Thus, when thickness of the coating is important, the monitoring means detects the thickness of the coating. When, as in the coating of selenium for purposes of creating an imaging member, the density of the coating is a proper measure of quality, a density detecting means is employed. Such detection then allows the proper control over the amount of vapor emitted from crucible 1 by adjusting shutters 15 and 15a. Said shutters are moved in the direction shown by the double headed arrows adjacent thereto. Preferably, only shutter 15 is continuously adjusted in response to the results obtained by operating the shutter positioning means 17 as shown in FIG. 2. Shutter positioning means 17 can be operated manually by suitably extending shaft 33 outside of chamber 63. Preferably, monitoring means 81 is operatively associated with an electrically actuated drive means 83 which reversably drives shaft 33 of FIG. 2 thereby providing constant, automatic control over the property detected by monitoring means 81. Alternatively, monitoring means 81 can be operatively associated with any other mechanism which affects the coating operation such as the drive means (not shown) for substrate 67 to effect its speed of travel or heating means (also not shown) for roller 71 to adjust its temperature.

In a preferred embodiment, monitoring means 81 is a photometer as more fully described below, which measures the light density of the coating. The measurement is translated to electrical signals by a photomultiplier and such signals are employed to operate a motor which reversably drives shaft 33 of FIG. 2 to control the opening between shutters 15 and 15a and thus regulate the amount of vapors emitted through aperature 55 of FIG. 5.

The apparatus of this invention, particularly described in FIG. 5 above, is most advantageously employed to vapor deposit selenium on a softenable layer carried by a suitable carrier web. In this instance, substrate 67 in FIG. 5 is a multilayer substrate having a durable carrier web such as a polyester film, i.e., Mylar polyethylene terephthalate film commercially available from E. I. DuPont de Nemours & Co., overcoated with a thermoplastic softenable material (in practice any softenable material can be employed). Such materials for both the carrier web and softenable material are more fully described in the aforementioned U.S. Pat. No. 3,598,644. Such softenable materials preferably possess a melt viscosity in the range of from $10^3$ to about 10 poises. Typical materials include amorphous organic glasses, polystyrenes, copolymers of styrene and acrylates and methacrylates, polyolefins, polyesters, polycarbonates, silicones, alkyds and mixtures thereof.

In operation, the substrate 67 is heated as it passes over roller 71 thus softening the softenable material prior to its contact by selenium vapor emitted from exit aperture 23 of crucible 1. As the selenium condenses onto the softenable material it embeds itself at least partially therein and if the viscosity is sufficiently low may embed entirely therein. Substrate 67 is then passed over cooling roller 77 which raises the viscosity of the softenably material so that it can be stored on take up roll 79.

As is taught in U.S. Pat. No. 3,598,644, such selenium coating is made up of substantially completely discrete particles of selenium having a diameter in the range of from about 0.01 micron to about 2 microns. The coating thickness is generally up to about 2 microns. Such coatings of selenium as are desirably employed in the aforementioned migration imaging method described in U.S. Pat. No. 3,520,681 have a blue light density (Wratten No. 94) of 1.8–2.0 for a given white density of 1.0. The above-described apparatus and process of providing such imaging members have been found to provide uniform high quality product.

It is to be understood that the invention is not to be limited to the exact details of operation or exact embodiments shown and described above. Obvious modifications and equivalents will be apparent to one of ordinary skill in the art and the invention is therefore to be limited only by the scope of the appended claims.

What is claimed is:
1. A crucible comprising in combination:
   a. a reservoir to hold an evaporant;
   b. a variable aperture forming means over said reservoir forming an aperture for the control of the amount of vapor emitted from said reservoir;
   c. adjustment means to vary said aperture;
   d. a vapor exit chamber over said reservoir to receive vapors from said reservoir, said chamber formed by two end members extending above the ends of said reservoir joined by a concave side member extending from over one side of said reservoir and over said aperture and a vertical side member extending from over the opposite side of said reservoir, said members forming an exit aperture at the top for said vapors, and;
   e. a deflection baffle positioned on said vertical side member below said exit aperture and extending from said side for a distance sufficient to intersect any plane defined by a straight line between a boundary of said variable aperture to any point on said vertical side member above said baffle to provide a passage way for said vapor between said baffle and the side concave side member.

2. A crucible of claim 1 wherein said reservoir and said exit chambers are joined by common sides but interiorly divided by said aperture means.

3. A crucible of claim 1 wherein said variable aperture forming means comprises a pair of shutters movable in the horizontal plane.

4. A crucible of claim 3 wherein at least one of said shutters is adjustable by a gear train operatively associated with said shutter.

5. A crucible of claim 1 further including a table having a vertically adjustable bed upon which said crucible rests to raise and lower said crucible in the vertical plane.

6. A crucible of claim 1 wherein said baffle is positioned from about one-half to about two-thirds of the distance between said variable aperture and said exit aperture, as measured from said aperture.

7. A crucible of claim 1 further including means to control the temperature within said reservoir.

8. A crucible of claim 7 wherein said temperature control means includes an electrical power source operatively associated with said crucible whereby said crucible is heated by its own resistance to the flow of electrical current from and to said source.

9. A crucible of claim 8 wherein said control means includes a coolant transmitted through a continuous conduit into and out of said reservoir.

10. A crucible of claim 9 wherein said electrical power source is variable.

11. A crucible of claim 3 wherein the walls of said shutters are in U shaped configuration lying in the horizontal plane.

12. A crucible of claim 3 further including shield means above and below said shutters on the interior surfaces of said crucible adjacent said shutters and extending inwardly from said surfaces.

13. A crucible of claim 1 wherein said baffle also dimensionally stabilizes said vertical wall.

14. A crucible of claim 13 wherein said concave wall dimensionally stabilizes said crucible by means of its radius.

15. The crucible of claim 1 further including means in one of said end members for introducing evaporant into said reservoir.

16. An apparatus for vapor deposing material on a substrate member comprising in combination:
 a. means for forming an evacuatable enclosure;
 b. support means disposed in said enclosure for retaining a substrate member;
 c. a crucible in said enclosure and spaced from said substrate member for holding and evaporating a material for condensation onto said substrate, said crucible comprising, in combination;
  i. a reservoir to hold said material;
  ii. variable aperture forming means over said reservoir forming an aperture for the control of the amount of vapor emitted from said reservoir;
  iii. adjustment means to vary said aperture;
  iv. a vapor exit chamber over said shutters to receive vapors from said reservoir, said chamber formed by two end members joined by a concave side member extending from over one side of said reservoir and extending over said aperture and a vertical side member extending from over the other side of said reservoir, said members forming an exit aperture at the top for said vapors;
  v. a deflection baffle positioned on said vertical side member below said exit aperture and extending from said side for a distance sufficient to intersect any plane defined by a straight line between a boundry of said variable aperture to any point on said vertical side member above said baffle to provide a passage way for said vapor between said baffle and the side concave side member.

17. An apparatus of claim 16 wherein said support means comprises a feed roll, a guide roller positioned over said exit of said crucible, a takeup roller and drive means to pass a web entrained over said rollers past said exit aperture at a predetermined distance therefrom.

18. An apparatus of claim 17 wherein said guide roll contains a heating means and further including a cooling means for said web in its path of travel from said guide roller and said takeup roller.

19. An apparatus of claim 18 further including means to monitor a quality of said material on said substrate.

20. An apparatus of claim 19 further including drive means for said shutter positioning means operatively associated with said monitoring means to continuously adjust said variable aperture thereby regulating a quality of said coating.

21. An apparatus of claim 16 wherein said variable aperture means comprises a pair of shutters movable in the horizontal plane.

22. An apparatus of claim 21 further including shield means above and below said shutters on the interior sufaces of said crucible adjacent said shutters and extending inwardly from said surfaces.

23. An apparatus of claim 22 further including a gear train operative associated with at least one of said shutters to vary the position thereof.

24. An apparatus of claim 16 further including a bed for said crucible, said bed being adjustable in the vertical plane.

25. An apparatus of claim 16 wherein said exit aperture is held at a distance from said material in the range of from about ⅜ inch to about 1 inch.

26. The apparatus of claim 16 wherein said crucible further includes means in one of said end members for introducing evaporant into said reservoir.

27. An apparatus for vapor depositing material on a substrate member, comprising in combination:
 a. means for forming an evacuatable enclosure;
 b. support means disposed in said enclosure for retaining a substrate comprising a feed roll, a guide roll, means for heating said guide roll, a cooling roll and a takeup roll;
 c. a crucible in said enclosure and spaced a predetermined distance from said substrate for holding and evaporating a material to be condensed onto said substrate said crucible comprising in combination:
  i. a reservoir to hold said material;
  ii. a pair of variably positioned aperture forming shutters over said reservoir for the control of the amount of vapor emitted from said reservoir;
  iii. drive means operatively associated with at least one of said shutters to continuously adjust the position of said shutter;
  iv. a vapor exit chamber over said shutters to receive vapors from said reservoir, said chamber formed by two end members joined by a concave side member extending from one side of said reservoir and over said aperture formed by said shutters, and a vertical side member extending from over the other side of said reservoir, said members forming an exit aperture at the top for said vapors emitted from said reservoir to contact and condense on said substrate to form a coating thereon;
  v. a deflection baffle positioned on said vertical side member below said exit aperture and extending from said side for a distance sufficient to intersect any plane defined by a straight line between a boundary of said variable aperture to any point on said vertical side member above said baffle to provide a passage way for said vapor between said baffle and the side concave side member.
  vi. shield means positioned above and below said shutters on the interior surfaces of said crucible adjacent said shutters and extending inwardly from said surfaces to allow free movement of said shutters;
  vii. means for controlling the temperature of said material in said reservoir, and;
 d. a coating monitoring means mounted downstream from said cooling roller to measure a quality of said coating on said substrate, said monitoring means operatively associated with said drive means to continuously adjust the position of said shutter in response to said quality of said coating.

28. An apparatus of claim 27 wherein said means for controlling the temperature further includes an electric power supply operatively associated with said crucible whereby said crucible is heated by its own resistance to the flow of electric current therethrough.

29. An apparatus of claim 27 further including a bed for said crucible, said bed being adjustable in the vertical plane.

30. An apparatus of claim 27 wherein said reservoir and said exit chambers are joined by common end members but interiorly divided by said shutters.

31. An apparatus of claim 27 wherein said baffle is positioned from about one-half to about two-thirds the distance between said shutters and said exit aperture, as measured from said aperture.

32. An apparatus of claim 28 further including means to cool the material in said reservoir.

33. An apparatus of claim 27 wherein said baffle also dimensionally stabilizes said vertical side.

34. An apparatus of claim 27 wherein said concave wall dimensionally stabilizes said crucible.

35. An apparatus of claim 27 wherein said monitoring means determines the optical density of said coating.

36. The apparatus of claim 27 wherein said crucible further includes means in one of said end members for introducing evaporant into said reservoir.

* * * * *